United States Patent [19]

Guisinger

[11] 4,383,205
[45] May 10, 1983

[54] MOTOR DRIVE AMPLIFIER
[75] Inventor: Barrett E. Guisinger, Saratoga, Calif.
[73] Assignee: Sony Corporation, Japan
[21] Appl. No.: 324,774
[22] Filed: Nov. 25, 1981
[51] Int. Cl.³ .......................................... H02K 29/00
[52] U.S. Cl. .................................... 318/254; 318/138
[58] Field of Search ............... 307/312; 318/138, 254, 318/254 A; 330/263, 265, 268

[56] References Cited

U.S. PATENT DOCUMENTS 4,114,073  9/1978  Uzuka ................................. 318/138
4,176,323  11/1979  Odell ................................... 330/263

FOREIGN PATENT DOCUMENTS 2623379  12/1977  Fed. Rep. of Germany ...... 330/265

Primary Examiner—J. V. Truhe
Assistant Examiner—S. M. Bergmann
Attorney, Agent, or Firm—Philip M. Shaw, Jr.

[57] ABSTRACT

A motor drive circuit comprising a differential amplifier having inverting and non-inverting inputs and further having an output which is connected to the inputs of separate NPN and PNP, super-alpha configured amplifiers whose combined outputs are supplied to one lead of a motor. The other lead of the motor is connected through a resistor to the circuit ground. The voltage developed across this resistor is supplied to the inverting input of the differential amplifier such that the current through the motor will be equal to the input voltage supplied to the non-inverting input of the differential amplifier divided by the resistance of the resistor.

10 Claims, 3 Drawing Figures

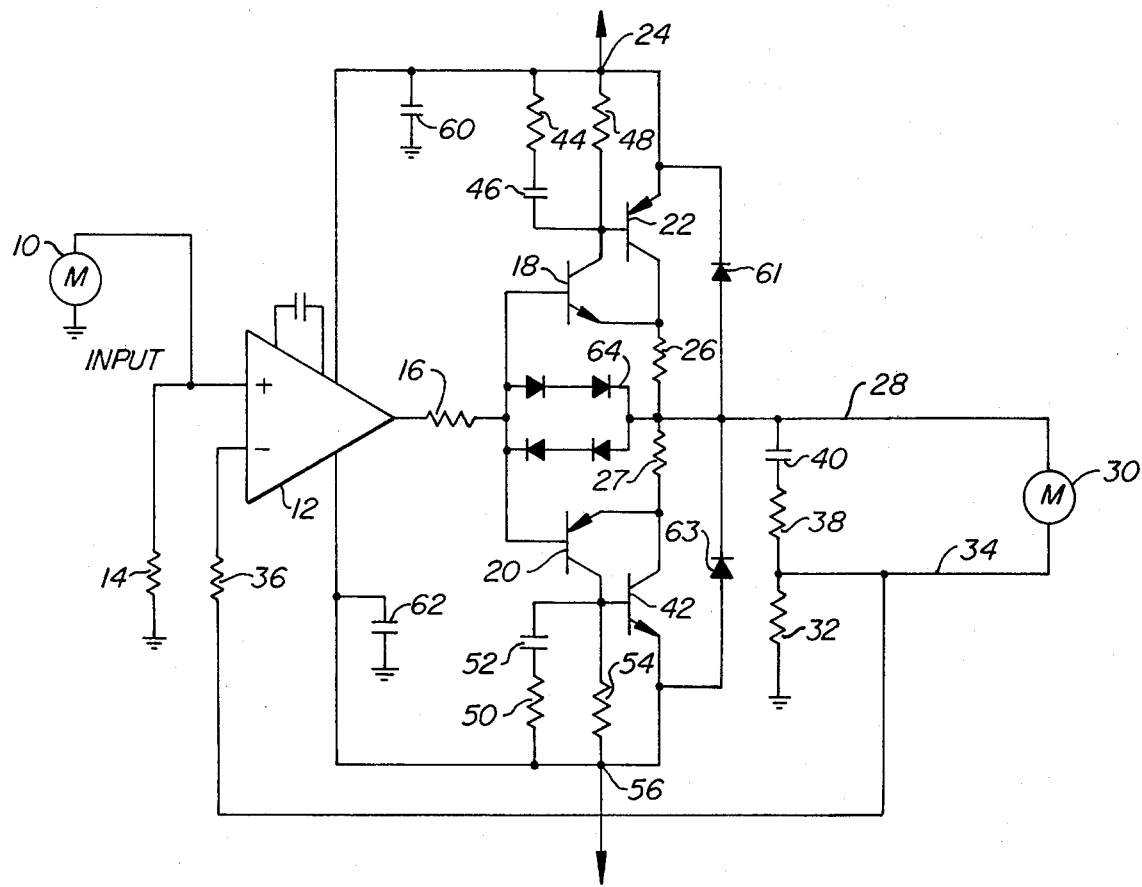
FIG._1.

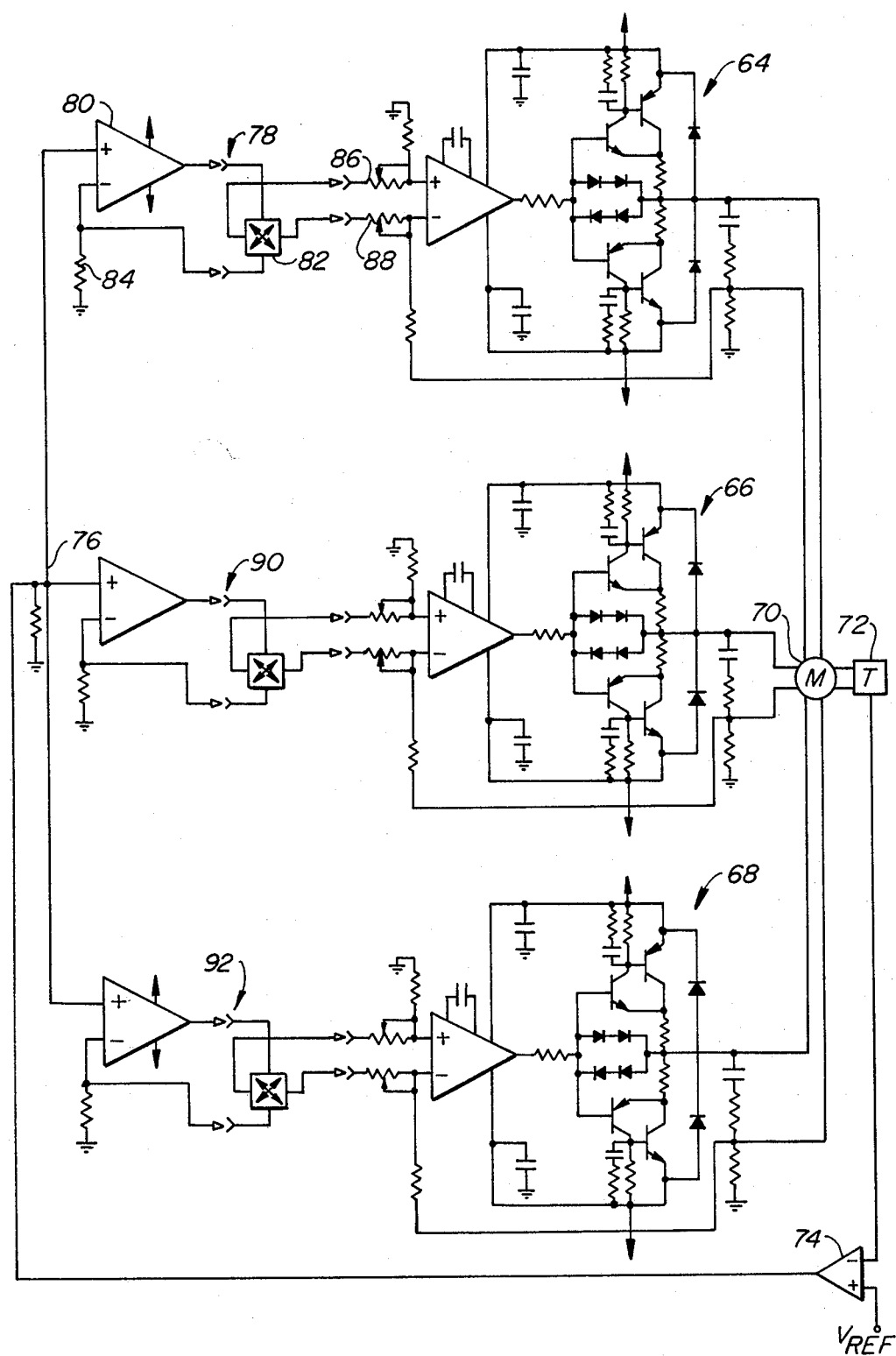
FIG._2.

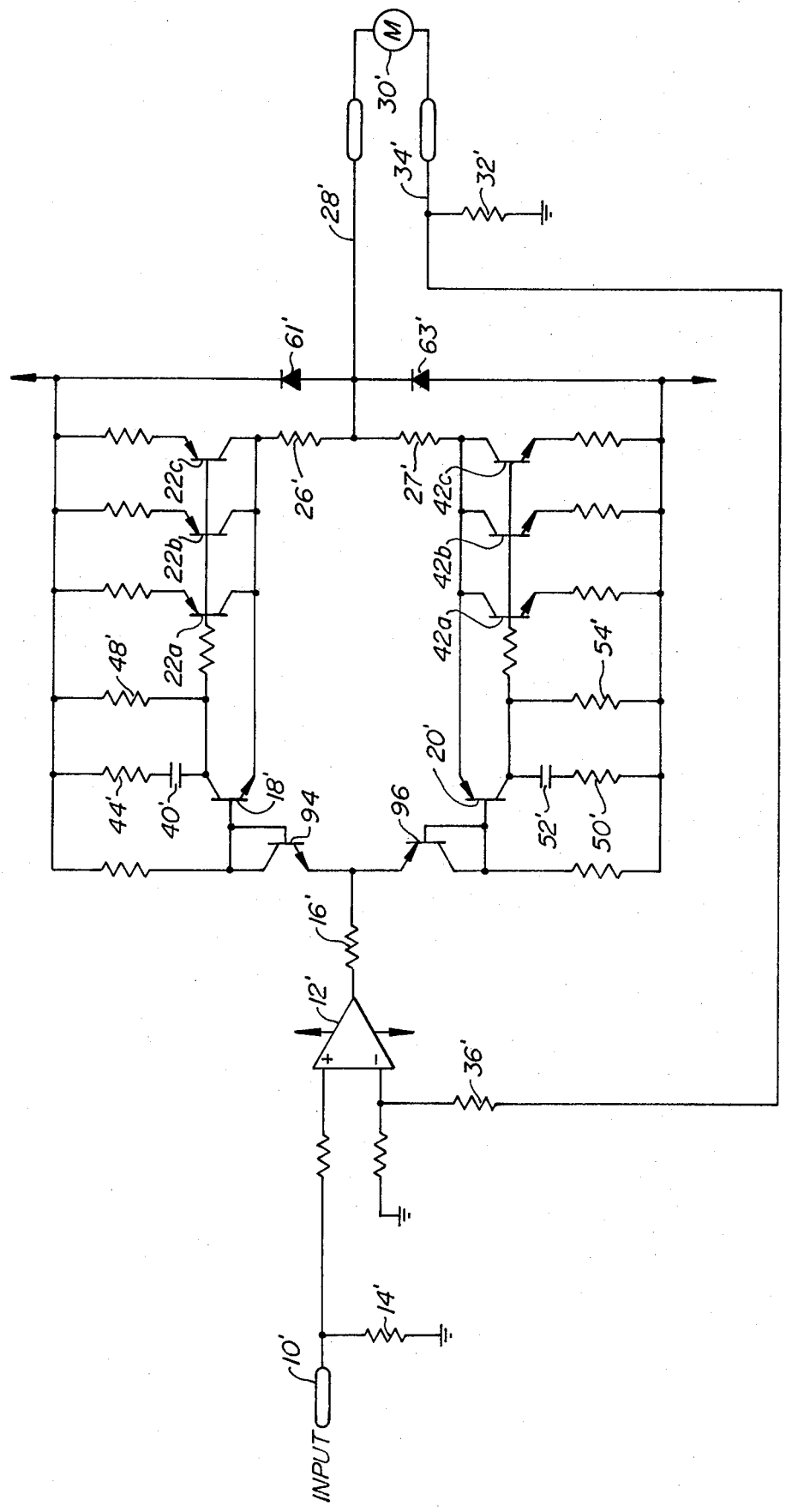
FIG._3.

MOTOR DRIVE AMPLIFIER

BACKGROUND OF THE INVENTION

This invention relates to a motor drive amplifier and, more particularly, to an amplifier for use in driving the motor of a video tape recorder/player.

Prior art motor drive circuits typically utilize a square wave signal to drive the motors. It is principally only the fundamental of the square wave which is the main driving force. The harmonics of the square wave produce no driving force and are simply wasted as heat. Furthermore, most prior art motor drive amplifiers have a standing current which can lead to thermal run away. Again, this results in inefficiency and wasted energy. Still another problem with prior art motor drive circuits is time delay in the output stages of the motor drive amplifier. Each additional stage of amplification increases the time delay of the signal passing through. This translates into a narrower bandwidth than might otherwise be available because as the time delay begins to approach one-half of the period of the input signal waveform (i.e. a 180° phase shift) the "negative" feedback circuit of the amplifier is supplying positive feedback, thereby causing oscillation.

SUMMARY OF THE INVENTION

The above and other problems with prior art motor drive amplifier circuits are overcome by the present invention of a motor drive amplifier for use with a motor of the type having an input and an output lead, the motor drive amplifier comprising a circuit ground, a differential amplifier having inverting and non-inverting input terminals, and an output terminal, and dual, super alpha configured transistor amplifiers of opposite polarities. Each of the super alpha configured amplifiers has a separate input terminal, which is connected to the output of the differential amplifier, and a separate output terminal. A resistor is connected between the motor output lead and the circuit ground. The motor output lead is also connected to the inverting input of the differential amplifier. The outputs of the super alpha configured amplifiers are connected to the motor input lead so that, when an input signal is applied to the non-inverting input of the differential amplifier, a current will flow to the motor. The magnitude of the current will be equal to the voltage at the non-inverting input of the differential amplifier divided by the resistance connected between the motor output lead and the circuit ground.

This circuit produces less cross over distortion because, in switching from one conducting super-alpha configured amplifier to another, the input voltage only has to change from two base to emitter voltage drop ($V_{BE}$) whereas, in prior art configurations, this voltage would have to be doubled before cross over would take place. Because of the super-alpha configuration of the twin amplifiers, if there is no error signal applied to the input of the super-alpha configured amplifiers, they are turned off, and there is no standing current passing through the motor. This results in greater efficiency of the motor drive circuit.

It is, therefore, an object of the present invention to provide a motor drive amplifier which has no standing current requirement.

It is still another object of the invention to provide a motor drive amplifier with a wider bandwith than in prior art such circuits.

It is yet another object of the invention to provide a motor drive amplifier having less time delay in the output stage than prior art such circuits.

It is yet a further object of the invention to provide a motor drive amplifier suitable for being driven by a sine wave.

The novel features which are believed to be characteristic of the invention, both as to organization and method of operation, together with further advantages thereof, will be better understood from the following drawings, in which several preferred embodiments of the invention are illustrated by way of example.

BRIEF DESCRIPTION OF THE DRAWINGS

FIG. 1 is a schematic diagram of a motor drive amplifier according to a first embodiment of the invention.

FIG. 2 is a schematic diagram of a three-phase motor drive amplifier according to a second embodiment of the invention; and FIG. 3 is a schematic diagram of a motor drive amplifier according to a third embodiment of the invention.

DETAILED DESCRIPTION OF CERTAIN PREFERRED EMBODIMENTS

Referring now more particularly to FIG. 1, a motor drive circuit is illustrated in which an error signal source 10 supplies an error signal to the non-inverting input of a differential amplifier 12. This same input is connected to the circuit ground through a resistor 14. The output of the differential amplifier 12 is supplied through a resistor 16 to the base terminals of an NPN transistor 18 and a PNP transistor 20. The collector of transistor 18 is connected to a base terminal of a PNP transistor 22 and through a resistor 48 to a terminal 24 connected to an external power supply source. The collector of transistor 18 is also connected in series with a capacitor 46 and a resistor 44 to the terminal 24. The emitter of transistor 22 is connected directly to the terminal 24 and to the cathode of a diode 61.

The emitter of transistor 18 is connected to the collector of transistor 22 and also through a resistor 26 to the input lead 28 of a motor 30. Also connected to the lead 28 is the anode of diode 61. The motor return lead 34 is connected through a resistor 32 to the circuit ground. The lead 34 is also connected through a resistor 36 to an inverting input of the differential amplifier 12. A resistor 38 is connected in series with a capacitor 40 between the lines 28 and 34.

The collector of transistor 20 is connected to the base terminal of an NPN transistor 42 and is also connected through a resistor 54 to a terminal 56. The collector of the transistor 20 is also connected to the terminal 56 through a series connection of a capacitor 52 and a resistor 50. An external power supply source is connected to the terminal 56. Typically, a +15 Volt potential is applied to the terminal 24 and a −15 Volt potential is applied to the terminal 56 from the external source (not shown), these potentials being taken with respect to the circuit ground.

The emitter of transistor 20 is connected to the collector of transistor 42 and is also connected through a resistor 27 to the motor lead 28. The anode of a diode 63 is connected to the emitter of transistor 42. The cathode of diode 63 is connected to the line 28. Capacitors 60 and 62 are connected between the terminals 24 and 56 to the circuit ground, respectively. The power supply points 24 and 56 are also connected to the differential amplifier 12 to supply suitable biassing. A series connected diode circuit 64 is connected between the base terminals 18 and 20 and the motor lead 28 to act as a current limiter.

Before describing the operation of the motor drive amplifier circuit depicted in FIG. 1, it should be noted that the transistors 18 and 22 and the transistors 20 and 42 are connected in what is known as the super-alpha configuration. In such configuration each pair of transistors operates in a manner to be the equivalent of one transistor having a super-alpha characteristic. Such a configuration, when viewed as such a combined transistor, has a base to output emitter voltage drop which is roughly half that in the more conventional Darlington configuration.

In operation, an error signal input from the source 10 is amplified by the amplifier 12 to produce an output voltage through the resistor 16 to the bases of the transistors 18 and 20. Unless a voltage which is equivalent to at least two $V_{BE}$ is produced by the amplifier 12, the transistors 18 and 20 are turned off and no current will be drawn from the terminals 24 and 56. With the transistors 18 and 20 turned off, the output power transistors 22 and 42 will also be turned off and there will be no standing current flowing through the motor 30. If, however, an error signal voltage is produced at the output of the amplifier 12 which exceeds two $V_{BE}$, for example a voltage sufficient to produce +1 Volt at the lead 34, then the motor drive amplifier circuit will produce sufficient current to cause a flow of 10 amperes to flow through the motor 30. This is derived by dividing the voltage at the non-inverting input of amplifier 12 by the resistance of resistor 32. This follows from the theory of operation of the differential amplifier 12 which will adjust its output until the difference of its input is zero. In the preferred embodiment, resistor 32 is a 0.1 ohm resistance.

Referring now more particularly to FIG. 2, the same motor drive amplifier circuit depicted in FIG. 1 is repeated three times in circuits 64, 66 and 68 whose outputs drive three separate sets of windings of a three phase, brushless D.C. motor 70. The output shaft of the motor 70 is coupled to a tachometer 72 which produces an output signal representative of the rotational speed of the motor 70.

This tachometer output signal is supplied to the inverting input of a differential amplifier 74. A reference voltage from an external source is supplied to the non-inverting input of the amplifier 74. The output of the amplifier, representing the difference of the inputs, constitutes a motor control error signal which is supplied to an input line 76. The magnitude and polarity of the reference voltage sets the steady state operating speed and direction of rotation of the motor 70. It will be appreciated that the motor 70 can be easily stopped abruptly by the application of a reference voltage of the opposite polarity to the non-inverting input terminal of the amplifier 74.

In order to distribute the error signal in phase to the proper motor drive amplifier circuits 64, 66 or 68, a plurality of separate Hall sensor circuits 78, 90 and 92 are utilized in conjunction with the circuits 64, 66 and 68, respectively. Since each of the circuits 78, 90 and 92 are the same, only one such circuit will be described.

The error signal input line 76 is supplied to the non-inverting input of a differential amplifier 80 whose output is supplied to one input lead of a Hall sensor 82. The other input lead of the Hall sensor 82 is connected to the circuit ground through a resistor 84 and is connected directly to the inverting input of the differential amplifier 80. The magnetic sensitivity of a Hall sensor is largely a function of the magnitude of the current flowing through the input leads of the Hall sensor. The resistance, however, of a Hall sensor is highly temperature dependent. Thus applying a constant voltage across a Hall sensor will make its magnetic sensitivity be dependent on temperature, whereas applying a constant current through the Hall sensor input leads will make its magnetic sensitivity relatively non-temperature dependent. Putting the Hall sensor input leads in series in the feedback loop of the amplifier 80 ensures a constant current flow and thus greatly eliminates temperature dependence. The output current from the Hall sensor is the error signal input voltage to the differential amplifier 80 divided by the resistor 84, which in the preferred embodiment of the invention, is 100 ohms.

The Hall devices 82 of the circuits 78, 90 and 92 are positioned at 120° intervals around the stator of the motor 70 and are aligned with respect to the motor's phase coils to detect the poles of the rotor. The output of the Hall device is a signal whose magnitude and polarity is dependent upon both the intensity and polarity of the magnetic field impinging upon the Hall device 82 from the rotor of the motor 70 and the magnitude and polarity of the error current flowing through the sensor from the amplifier 80. For example, for an error signal of a given voltage and polarity the output of the Hall device will be sinusoidal as the pole of the rotor first approaches and then passes the Hall device during a cycle of rotation.

The output of each Hall device is separately supplied through rheostats 86 and 88 to the inverting and non-inverting inputs of the differential amplifiers of the circuits 64, 66 and 68. Thus the motor 70 will be driven by currents supplied to its three phase windings which are in phase with the speed and direction of rotation of the rotor of the motor. It will be noted in passing that the signal which is used to drive the motor is a sine wave rather than a square wave, thereby eliminating the waste heat which is produced when such a motor is driven by a square wave. In this way, the motor is approximately 80% efficient as compared to a 45% efficient motor driven in the conventional way.

Referring now more particularly to FIG. 3, a modified motor drive amplifier according to the invention is illustrated. This amplifier is substantially the same as the amplifier depicted in FIG. 1 and accordingly the same elements serving the same purpose have been given the same reference numerals primed. The principal differences between the embodiment of FIG. 3 and that shown in FIG. 1 are that the output transistors corresponding to transistors 22 and 42 in the embodiment of FIG. 1 have each been connected in parallel with two other power transistors so that a higher output capacity is available. Thus the transistor 18' is connected to power transistors 22a, 22b and 22c, all connected in parallel and the transistor 20' is connected to the transistors 42a, 42b and 42c, all connected in parallel. The connections between these various transistors are the same as those depicted in FIG. 1.

The second difference is that the output of the differential amplifier 12', supplied through the resistor 16' to the bases of the transistors 18' and 20', first passes through separate transistors 94 and 96 connected to operate as diodes. Thus the transistor 94 has its base and collector connected to the base of the transistor 18' and the transistor 96 has its base and collector connected to the base of transistor 20', respectively. The emitters of the transistors 94 and 96 are connected to the output of the differential amplifier 12' through the resistor 16'. The transistors 94 and 96 are on a common heat sink as are the transistors 18' and 20' so that they thermally track each other. The purpose of the transistors 94 and 96 is to eliminate base spreading. Without these transistors there would be a certain amount of cross-over distortion which, although in a motor drive amplifier is not terribly significant, would have a more noticeable effect if the amplifier were used for other purposes such as a high fidelity amplifier. In practice, the circuit depicted in FIG. 3 can be used without the transistors 94 and 96 and with the output of the amplifier 12' connected directly to the bases of the transistors 18' and 20' through the resistor 16'.

In all of the above-described embodiments the number of stages of amplification have been kept to a minimum, in order to minimize time delay and thus increase bandwidth, while at the same time preserving voltage and power gain.

Although the drive amplifier of the invention has been described in conjunction with a motor, the drive amplifier is suitable for driving other types of loads, such as audio speakers for example.

The terms and expressions which have been employed here are used in terms of description and not of limitation and there is no intention, in the use of such terms and expressions, of excluding equivalents of the features shown and described, or portions thereof, it being recognized that various modifications are possible within the scope of the invention as claimed.

What is claimed is:

1. In combination with a load, a drive amplifier circuit for driving the load in response to a drive input signal, the amplifier circuit comprising a circuit ground, a differential amplifier having an inverting input terminal, a non-inverting input terminal for receiving a drive input signal, and an output terminal, dual, super-alpha configured current amplifiers of opposite polarities, each having a separate input terminal and a separate output terminal, first resistance means connected in series with the load between the outputs of the super-alpha configured amplifiers and the circuit ground, means connecting the inverting input of the differential amplifier to a point in the series connection between the load and the first resistance means, and wherein the output of the differential amplifier is connected to the inputs of the super-alpha configured current amplifiers, whereby, when said drive input signal is applied to the non-inverting input of the differential amplifier, a current equal to the voltage magnitude of the drive input signal divided by said first resistance means will flow through the load.

2. The combination as recited in claim 1 wherein said load is a motor.

3. The combination as recited in claim 2 wherein the motor is of the brushless, direct-current type.

4. The combination as recited in claim 2 wherein the motor is of the multiphase type having a separate set of windings for each phase, and further comprising a plurality of drive amplifier circuits, each being connected to drive a separate phase winding of the motor.

5. The combination as recited in claim 4 wherein the motor has a rotor and a stator and further comprising means for sensing the angular position of the rotor and for distributing the drive input signal to each of the amplifier circuits as a function of the angular position of the rotor such that the drive amplifiers supply in phase driving currents to the motor phase windings.

6. The combination as recited in claim 2 or 5 further comprising means driven by the motor for producing said drive input signal, said drive input signal having a magnitude which varies inversely with the speed of the motor.

7. The combination as recited in claim 5 wherein said means for sensing the angular position of the rotor comprises a plurality of Hall sensors positioned around the stator in registry with the phase windings, each of said Hall sensors having a pair of input terminals and a pair of output terminals, and a plurality of sensor amplifiers, one for each Hall sensor, each sensor amplifier having a non-inverting input which is supplied with the drive input signal, an inverting input and output, and wherein the input terminals of each Hall sensor are connected in series between the output terminal and the inverting input terminal of a separate one of the sensor amplifiers and wherein the output terminals of each Hall sensor are connected to the input terminals of a separate one of the differential amplifiers of the drive amplifier circuits.

8. An amplifier drive circuit for a load, the amplifier drive circuit comprising a circuit ground, a differential amplifier having a non-inverting input terminal, an inverting input terminal, and an output terminal, first and second NPN transistors, first and second PNP transistors, first and second resistance means, biassing means for supplying biassing voltages to the first and second NPN transistors and the first and second PNP transistors, and means for supplying an error signal to the non-inverting input of the differential amplifier, and wherein the output terminal of the differential amplifier is connected to the base terminals of the first NPN transistor and the second PNP transistor, the collector of first NPN transistor is connected to the base terminal of the first PNP transistor, the emitter of the first NPN transistor is connected to the collector of the first PNP transistor, to the input lead of the load, to the emitter of the second PNP transistor and to the collector of the second NPN transistor, and is also connected in series with the load and the second resistance means to the inverting input of the differential amplifier, the first resistance means is connected between the circuit ground and the junction of the load and the second resistance means, the collector of the second PNP transistor is connected to the base terminal of the second NPN transistor and the emitter of the second PNP transistor is connected to the base terminal of the second NPN transistor.

9. A drive amplifier circuit as recited in claim 8 wherein the load is a brushless DC motor.

10. A drive amplifier circuit as recited in claim 8 or 9 wherein the load is a three-phase motor having three separate pairs of input and output leads, and further comprising three separate amplifier drive circuits, one associated with each pair of input and output leads, and further comprising means sensitive to the rotational position of the motor for distributing the error signal to the three drive circuits in correspondence with the angular position of the motor rotor.

* * * * *